(12) United States Patent
Cui et al.

(10) Patent No.: US 10,573,235 B2
(45) Date of Patent: Feb. 25, 2020

(54) DISPLAY PANEL AND DISPLAY APPARATUS

(71) Applicant: WUHAN TIANMA MICRO-ELECTRONICS CO., LTD., Wuhan (CN)

(72) Inventors: Ruili Cui, Wuhan (CN); Chao Peng, Wuhan (CN); Yongzhi Wang, Wuhan (CN); Tao Peng, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/199,053

(22) Filed: Nov. 23, 2018

(65) Prior Publication Data

US 2019/0362672 A1  Nov. 28, 2019

(30) Foreign Application Priority Data

May 25, 2018  (CN) .......................... 2018 1 0516345

(51) Int. Cl.
*G09G 3/3233* (2016.01)
*G06K 9/00* (2006.01)
(Continued)

(52) U.S. Cl.
CPC ......... *G09G 3/3233* (2013.01); *G06K 9/0004* (2013.01); *H01L 27/3234* (2013.01); *H01L 27/3262* (2013.01); *H01L 27/3265* (2013.01); *H01L 27/3276* (2013.01); *G09G 2320/0233* (2013.01); *H01L 27/14678* (2013.01)

(58) Field of Classification Search
CPC ......... G09G 3/3233; G09G 2320/0233; G06K 9/0004
See application file for complete search history.

(56) References Cited

U.S. PATENT DOCUMENTS 10,095,349 B2 * 10/2018 Han .................... G06F 3/044
10,176,358 B2 *  1/2019 Han .................... G06K 9/0002
(Continued)

FOREIGN PATENT DOCUMENTS

| CN | 107066162 A | 8/2017 |
| CN | 107194321 A | 9/2017 |
| CN | 107886040 A | 4/2018 |

*Primary Examiner* — Michael Pervan
(74) *Attorney, Agent, or Firm* — Anova Law Group PLLC

(57) ABSTRACT

A display panel and a display apparatus are provided. An exemplary display panel includes a display area having light-emitting areas and non-light-emitting areas and divided into a fingerprint identification area and a non-fingerprint identification area; an array layer including pixel driving circuits; a display layer disposed on a side of the array layer adjacent to a light-emitting surface of the display panel and including light-emitting devices; and a light-sensing device disposed in the fingerprint identification area and the non-light emitting area. A number of the light-emitting devices in an unit area in the fingerprint identification area is smaller than that in the unit area of the non-fingerprint identification area; and under a same gray scale driving signal, an absolute value of a difference N between a brightness of the fingerprint identification area and a brightness of the non-fingerprint identification area is smaller than or equal to 100 nit.

20 Claims, 6 Drawing Sheets

(51) Int. Cl.
    *H01L 27/32*     (2006.01)
    *H01L 27/146*     (2006.01)

(56) References Cited

U.S. PATENT DOCUMENTS

| | | | |
|---|---|---|---|
| 10,468,464 B2* | 11/2019 | Yang | H01L 27/3234 |
| 2012/0105081 A1* | 5/2012 | Shaikh | G06F 3/044 |
| | | | 324/686 |
| 2016/0350571 A1* | 12/2016 | Han | G06K 9/0002 |
| 2017/0336910 A1* | 11/2017 | Han | G06F 3/0416 |
| 2018/0019288 A1* | 1/2018 | Yang | H01L 27/3227 |
| 2018/0096660 A1* | 4/2018 | Liu | G09G 3/2003 |

* cited by examiner

DISPLAY PANEL AND DISPLAY APPARATUS

CROSS-REFERENCES TO RELATED APPLICATIONS

This application claims priority of Chinese Patent Application No. 201810516345.0, filed on May 25, 2018, the entire contents of which are hereby incorporated by reference.

FIELD OF THE DISCLOSURE

The present disclosure generally relates to the field of display technology and, more particularly, relates to a display panel and a display apparatus.

BACKGROUND

With the continuous development of science and technologies, many display devices having fingerprint identification functions, such as cell phones, tablets, and smart wearable apparatus, etc., have been developed. Fingerprint is the unique natural pattern of ridges on tips of human fingers. Using the fingerprint identification function improves the safety factor of the display devices. Before operating a display apparatus having the function of the fingerprint identification, a user only has to touch the display apparatus using a finger to verify the user authorization. Thus, the authorization process is simplified.

Smart mobile devices, such as cell phones and smart bracelets, are already equipped with fingerprint identification modules. However, currently the fingerprint identification modules are often disposed in non-display areas of the display apparatus, which reduces the screen-to-body radio of the display apparatus. The fingerprint identification modules of some mobile phones are disposed on the back of the mobile phones, but the user experience is reduced. With the introduction of the full screen, the display apparatus of which the fingerprint identification modules are disposed in the display area has become a recent development trend of mobile phones. Disposing the fingerprint identification modules on the display area needs a light-sensing fingerprint identification technology. The light-sensing fingerprint identification technology often detects the light reflected to the fingerprint identification unit via the touch body (for example, a finger). That is, the ridges and valleys of the fingerprint are determined to achieve the fingerprint identification.

However, current display panels and display apparatus often do not have high precision fingerprint identification and uniform display brightness. The disclosed display panel and display apparatus are directed to solve one or more problems set forth above and other problems in the art.

BRIEF SUMMARY OF THE DISCLOSURE

One aspect of the present disclosure provides a display panel. The display panel includes a display area having a plurality of light-emitting areas and a plurality of non-light-emitting areas surrounding the light-emitting areas and divided into a fingerprint identification area and a non-fingerprint identification area; an array layer including a plurality of pixel driving circuits; a display layer disposed at a side of the array layer adjacent to a light-emitting surface of the display panel and including a plurality of light-emitting devices; and a light-sensing device disposed in the fingerprint identification area and the non-light-emitting area. A number of the light-emitting devices in an unit area in the fingerprint identification area is smaller than a number of the light-emitting devices in the unit area of the non-fingerprint identification area; and under a same gray scale driving signal, an absolute value of a difference N between a brightness of the fingerprint identification area and a brightness of the non-fingerprint identification area is smaller than or equal to 100 nit ($|N|\leq 100$ nit).

Another aspect of the present disclosure provides a display apparatus. The display apparatus includes a display panel. The display panel includes a display area having a plurality of light-emitting areas and a plurality of non-light-emitting areas surrounding the light-emitting areas and divided into a fingerprint identification area and a non-fingerprint identification area; an array layer including a plurality of pixel driving circuits; a display layer disposed on a side of the array layer adjacent to a light-emitting surface of the display panel and including a plurality of light-emitting devices; and a light-sensing device disposed in the fingerprint identification area and the non-light emitting area. A number of the light-emitting devices in an unit area in the fingerprint identification area is smaller than a number of the light-emitting devices in the unit area in the non-fingerprint identification area; and under a same gray scale driving signal, an absolute value of a difference N between a brightness of the fingerprint identification area and a brightness of the non-fingerprint identification area is smaller than or equal to 100 nit ($|N|\leq 100$ nit). The display panel also includes a packaging structure and a fingerprint identification apparatus.

Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrate embodiments of the present disclosure and, together with the detailed description, serve to explain the mechanism of the present disclosure.

DETAILED DESCRIPTION

Figure 1:
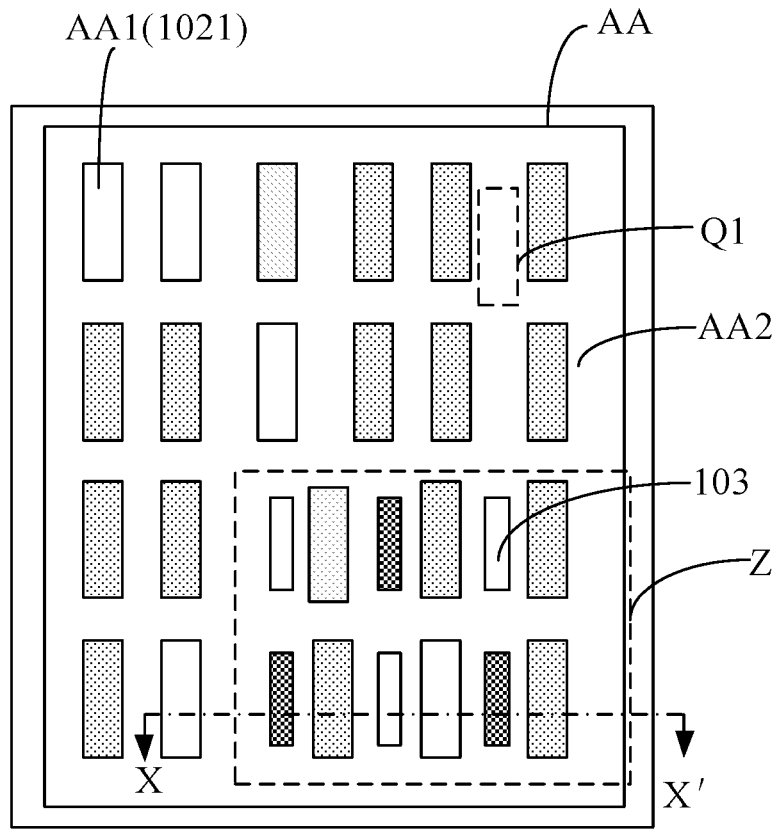
FIG. 1 illustrates a top view of an exemplary display panel consistent with various disclosed embodiments.

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined where there is no conflict.

Certain techniques, methods and apparatus that are familiar to the persons of ordinary skill in the art may not be described in detail. However, under appropriate conditions, such techniques, methods and apparatus are also included as the parts of the description.

In the disclosed embodiments, the specific values should be explained for illustrative purposes only and should not be used as limitations. Thus, embodiments may have different specific values.

Further, the similar symbols and letters in the drawings denote similar elements. Thus, once one element is defined in one drawing, it may not need to be defined in the following drawings.

The existing light-sensing fingerprint identification technology identifies a fingerprint by detecting the difference in intensity of the reflected light from the fingerprint ridges and valleys. Under the premise that the amount of light provided by the fingerprint identification light source is the same, when the fingerprint identification sensing unit (i.e., a light-sensing device) receives a substantially large amount of light, and the fingerprint identification precision is substantially high. When the light-sensing device receives less light, the fingerprint identification precision is substantially low. In order to improve the fingerprint identification precision sensitivity, the PPI (Pixels Per Inch) of the fingerprint identification area is reduced to reduce the arrangement number of pixel circuits. Further, the transmittance of the reflected light of the fingerprint is increased to increase the amount of light received by the light-sensing device. However, such approach reduces the brightness of the fingerprint identification area, and the brightness of the fingerprint identification area is smaller than the brightness of the non-fingerprint identification area. Thus, the display uniformity of the display panel is affected.

The present disclosure provides a display panel and a display apparatus. With a special design of pixel circuits in the fingerprint identification area, the brightness of the fingerprint identification area may be increased to allow the brightness of the fingerprint identification area to be substantially the same as the brightness of the non-fingerprint identification area. Accordingly, with the increase of the fingerprint identification precision, the reliability of the display panel may be ensured.

Figure 2:
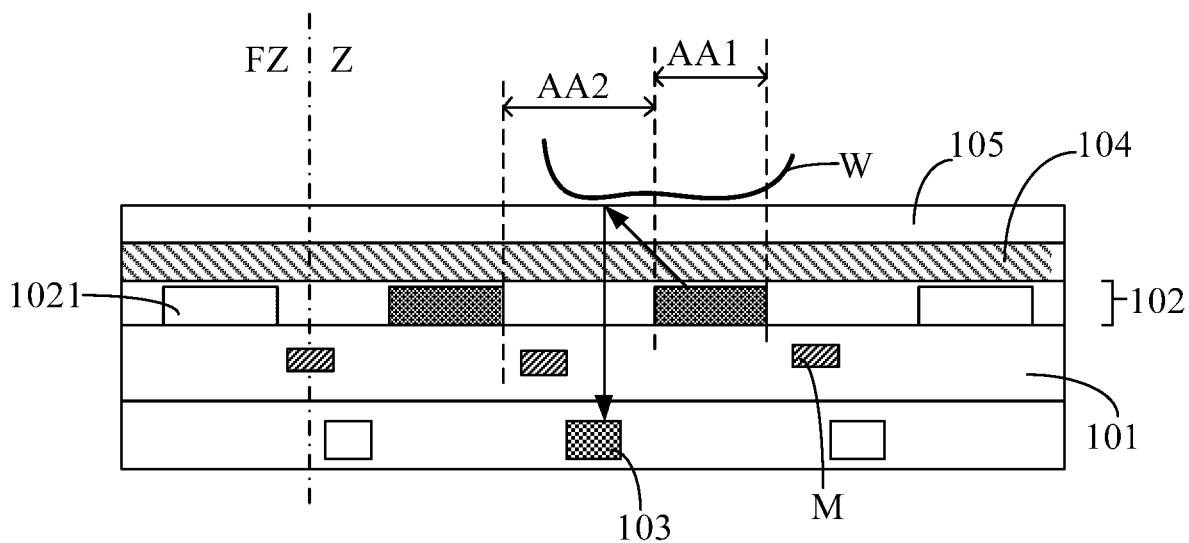
FIG. 2 illustrates a film structure at a tangent line X-X' of an exemplary display panel in FIG. 1.
Figure 3:
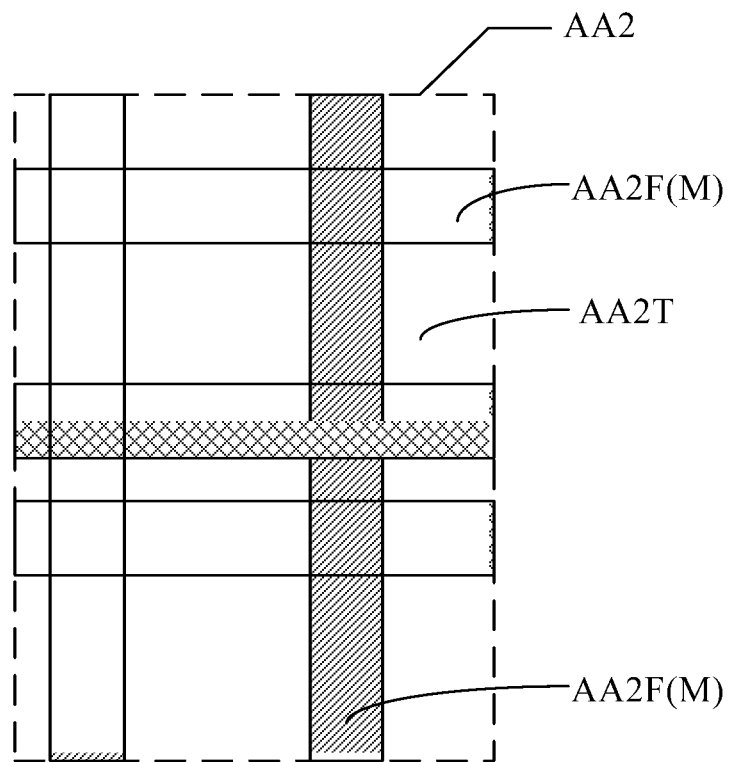
FIG. 3 illustrates a zoomed-in view of the non-light-emitting area Q1 in FIG. 1.

FIG. 1 illustrates a top view of an exemplary display panel consistent with various disclosed embodiments. FIG. 2 illustrates a film structure of an exemplary display panel at a tangential line X-X' in FIG. 1. FIG. 3 is a zoomed-in view of the non-light-emitting area Q1 in FIG. 1.

As shown in FIG. 1 and FIG. 2, the display panel may include a display area AA. The display area AA may include a plurality of light-emitting areas AA1 and a non-light-emitting area AA2 surrounding the light-emitting areas AA1. The display area AA may be divided into a fingerprint identification area Z and a non-fingerprint identification area FZ. The area except the fingerprint identification area Z in the display area AA may be configured as non-fingerprint identification area FZ. The fingerprint identification area Z may be disposed in the display area AA. The fingerprint identification function may be realized by placing a finger on the fingerprint identification area Z of the display panel. The position and the shape of the fingerprint identification area Z in FIG. 1 is for illustrative purposes only; and is not intended to limit the present disclosure.

Further, as shown in FIG. 2, the display panel may include an array layer 101. The array layer 101 may include a plurality of pixel driving circuits (not shown). The pixel driving circuit may include a thin film transistor (TFT), and a capacitor, etc. The pixel driving circuits may be used to drive the pixels to display. Further, the pixel driving circuits may include a plurality of metal wirings. The metal wirings may be the signal line portion of the circuits, the metal portion of the thin film transistors, and the metal portion of the capacitors, etc. As shown in FIG. 2, portions of the metal wirings M in the pixel driving circuits are disposed in the non-light-emitting area AA2. Because the metal wirings M may be made of a metal material, light cannot penetrate through the metal material, the areas where the metal wirings M are disposed in the non-light-emitting area AA2 may be a non-transmission region.

Further, as shown in FIG. 3, in the non-light-emitting region AA2, the non-transmission area AA2F may surround the plurality of transmission areas AA2T. The transmission areas AA2T may be scattered and of different sizes.

Further, referring to FIG. 2, the display panel may include a display layer 102 on a side of the array layer 101 adjacent to the light-emitting surface of the display panel. The display layer 102 may include a plurality of light-emitting devices 1021. In particular, one light-emitting area AA1 may include one light-emitting device 1021; and one pixel driving circuit may drive one light-emitting device 1021. The display panel may also include a light-sensing device 103 disposed in the fingerprint identification area Z and disposed in the non-light emitting area AA2.

Further, referring to FIG. 1, in the present disclosure, the number of the light-emitting devices 1021 in an unit area in the fingerprint identification area Z may be smaller than the number of the light-emitting devices 1021 in the unit area in the non-fingerprint identification area FZ. Under a same gray scale driving signal, the fingerprint identification area Z may have a first brightness, and the non-fingerprint identification zone FZ may have a second brightness. The difference between the first brightness and the second brightness may be referred as N; and $|N| \leq 100$ nit. The difference between the first brightness and the second brightness may be substantially small, and it may be difficult for human eyes to perceive the difference in brightness between the two areas. That is, in human eyes, the brightness of the fingerprint identification area and the brightness of the non-fingerprint identification area may be substantially the same. The first brightness and the second brightness may respectively represent the average brightness of the fingerprint identification area and the average brightness of the non-fingerprint identification area. In the present disclosure, the first brightness and the second brightness may be substantially the same. That is, the brightness values may not be much different.

In the present disclosure, the pixel circuit may be designed to improve the brightness of the fingerprint identification area, and the brightness difference between the fingerprint identification area and the non-fingerprint identification area may be minimized to ensure the brightness of the fingerprint identification area to be substantially the same as the brightness of the non-fingerprint identification area. As used herein, the gray scale represents a hierarchical level of different brightness from the darkest to the brightest. In the display panel, the data signals provided by the data line and the voltage applied on the data line may have a corresponding relationship with the gray scale of the light emitted by the light-emitting devices. The same gray scale driving signal may indicate that the data lines provide a same data signal. "nit" is the unit of brightness.

In the fingerprint identification area of the disclosed display panel, when displaying images, the light-emitting devices may be used as a light source for pixel illumination. When performing a fingerprint identification, the light-emitting devices may be multiplexed as a light source for the fingerprint identification.

In the fingerprint identification area of the disclosed display panel, during performing a fingerprint identification, the light-emitting devices may be used as a light source for the fingerprint identification. As shown in FIG. 2, the light emitted by the light-emitting device 1021 may reach a touch body W and may be reflected by the touch body W. The reflected light may pass through a portion of the film structure of the display panel in the non-light-emitting area AA2 and reach the light-sensing device 103. The light-sensing device 103 may perform the fingerprint identification after receiving the light reflected by the touch body W.

In the non-light-emitting area AA2, because light may be unable to pass through the areas having the metal wirings M, during the fingerprint identification stage, the light reflected by the touch body W may only be able to pass through the portion of the film structure of the display panel in the transmission area AA2T of the non-light-emitting area AA2 and reach the light-sensing device 103 to realize the fingerprint identification. One pixel driving circuit in the display panel may drive one light-emitting device. In the present disclosure, the number of the light-emitting devices in the unit area of the fingerprint identification area may be smaller than the number of the light-emitting devices in the unit area of the non-fingerprint identification area. Thus, the number of the pixel driving circuits disposed in an unit area in the fingerprint identification region may be smaller than the number of the pixel driving circuits disposed in an unit area in the non-fingerprint identification area.

In the fingerprint identification area, the number of pixel driving circuits in per unit area may be reduced. However, the distribution of the metal wirings in the pixel driving circuits may be the same as the distribution of the metal wirings in the non-fingerprint identification area. Thus, in the unit area, the proportion of the area where the metal wirings are disposed (i.e., the non-transmission area) may be reduced. That is, in the non-light-emitting area of the fingerprint identification area, the proportion of the light-transmitting area in per unit area may be increased. Thus, the area of the area where the fingerprint identification light passes through may be increased, and the transmittance of the fingerprint identification light may be increased. Accordingly, the amount of light required for the fingerprint identification and received by the light-sensing device may be increased, and the precision of the fingerprint identification may be improved.

In addition, in the present disclosure, under a same gray scale driving signal, the fingerprint identification area may have a first brightness, and the non-fingerprint identification area may have a second brightness. The difference between the first brightness and the second brightness is N, and |N|≤100 nit. The brightness of the fingerprint identification area and the brightness of the non-fingerprint identification area may be substantially the same, and human eyes may be unable to perceive the difference between the brightness of the fingerprint identification area and the brightness of the non-fingerprint identification area. Thus, in the display stage, the overall brightness of the display panel may be substantially uniform, and the display effect may be as desired.

In some embodiments, the first brightness may be equal to the second brightness to ensure the brightness of the fingerprint identification area to be substantially the same as the brightness of the non-fingerprint identification area. Thus, in the display phase, the overall brightness of the display panel may be substantially uniform, and the display effect may be as desired.

In one embodiment, in the disclosed display panel, the size of the light-emitting device in the fingerprint identification area may be the same as the size of the light-emitting device in the non-fingerprint identification area.

In one embodiment, referring to FIG. 2, the display panel may further include a packaging structure 104 on the display layer 102. The packaging structure 104 may be a thin film packaging structure, or a rigid packaging structure. The thin film packaging structure may include a packaging structure combined with a plurality of organic films and inorganic films. For example, the film packaging structure may be an alternately laminated structure of organic films and inorganic films. The organic films may be made of a polymer material, such as epoxy, phenolic or polyester, etc. The inorganic film may be made of silicon nitride, silicon oxynitride or metal oxide, etc. The rigid packaging structure may be a glass packaging structure. A cover plate 105 may also be disposed above the packaging structure 104. Further, the display panel may include other functional layer structures, such as a polarizer, etc.

Figure 4:
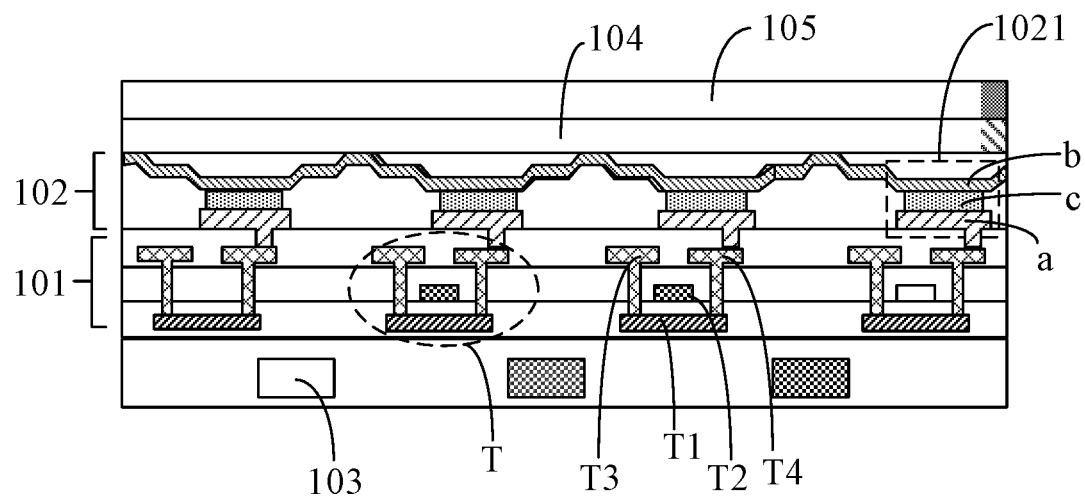
FIG. 4 illustrates another film structure of an exemplary display panel consistent with various disclosed embodiments.

FIG. 4 illustrates another film structure of an exemplary display panel consistent with various disclosed embodiments. In FIG. 4, a film layer structure of a fingerprint identification area is illustrated, and the light-emitting device 1021 may be an organic light-emitting (OLED) device. As shown in FIG. 4, the organic light-emitting device may include a first electrode a, a second electrode b, and an organic light-emitting layer c between the first electrode a and the second electrode b. The light-emitting device 1021 may be a top-emitting structure or a bottom-emitting structure.

For illustrative purposes, a top-emitting light-emitting device is illustrated in FIG. 4. In the top emitting light-emitting device, the first electrode a may be an anode, and configured as a reflective electrode. In particular, the first electrode a may include a structure of indium tin oxide-silver-indium tin oxide (ITO-Ag-ITO). The organic light-emitting layer c may include a red luminescent layer, a green luminescent layer and a blue luminescent layer. The second electrode b may be a cathode and a transparent electrode. The second electrode b may be made of Mg, or Ag, etc. The first electrode a may be able to effectively reflect the light emitted from the organic light-emitting layer c to the light-emitting side to improve the light-emitting efficiency. The holes injected from the anode a and the electrons injected from the cathode b may be combined in the organic light-emitting layer c to generate excitons. The excitons may fall from the excited state to the ground state to generate light. The light-emitting device 1021 may also include one or more of a hole injection layer, a hole transport layer, an electron barrier layer, a hole barrier layer, an electron transport layer, and an electron injection layer, etc.

The array layer 101 may include a plurality of thin film transistors T. The thin film transistors T may be used to form a pixel circuit. The pixel circuit may control the light-emitting device 1021 to emit light. Each of the thin film transistors T may include an active layer T1, a gate T2, a source T3, and a drain T4. According to the type of transistors, the first electrode a (anode) may be connected to the source T3 or the drain T4 of the thin film transistor T. For illustrative purposes, in FIG. 4, the first electrode a and the drain T4 are connected together. A top-gated thin film transistor structure is illustrated in FIG. 4. The thin film transistor may also be a bottom-gated structure.

Further, in some embodiments, in the disclosed display panel, under a same gray scale driving signal, the brightness of the light-emitting device in the fingerprint identification area may be greater than the brightness of the light-emitting device in the non-fingerprint fingerprint identification area. Refer to FIG. 1, in the display panel, the light emitted by the light-emitting device 1021 may be emitted from the surface of the display panel. Thus, the light-emitting area AA1 may be the area where the light-emitting device 1021 is disposed. In the present disclosure, the number of the light-emitting devices 1021 in an unit area of the fingerprint identification area Z may be smaller than the number of the light-emitting devices 1021 in the unit area of the non-fingerprint identification area FZ. Thus, the device density of the light-emitting devices 1021 in the fingerprint identification area Z may be reduced. Accordingly, the distribution area corresponding to the light emitted by each the light-emitting device 1021 in the fingerprint identification area Z may be greater than the distribution area corresponding to the light emitted by each light-emitting device 1021 in the non-fingerprint identification area FZ.

By setting the brightness of the light emitting device 1021 in the fingerprint identification area Z to be greater than the brightness of the light-emitting device 1021 in the non-fingerprint fingerprint identification area FZ, the brightness of the distribution area corresponding to the light emitted by each light-emitting device 1021 in the fingerprint identification area Z may be substantially the same as the brightness of the distribution area corresponding to the light emitted by each light-emitting device 1021 in the non-fingerprint identification areas FZ. Thus, under a same gray-scale driving signal, the brightness of the fingerprint identification area Z may be substantially the same as the brightness of the non-fingerprint identification area Z. Accordingly, the reliability of the display performance of the display panel may be ensured.

In addition, in the fingerprint identification stage, the light-emitting devices may be used as a light source for the fingerprint identification. Thus, the brightness of the light-emitting devices in the fingerprint identification area may be increased, and the light intensity of the light emitted by the light-emitting devices in the fingerprint identification area may be increased. Accordingly, the amount of the fingerprint identification light irradiating onto the touch body may be increased. Thus, the amount of light received by the light-sensing device may be increased, and the precision of the fingerprint identification may be further improved.

Figure 5:
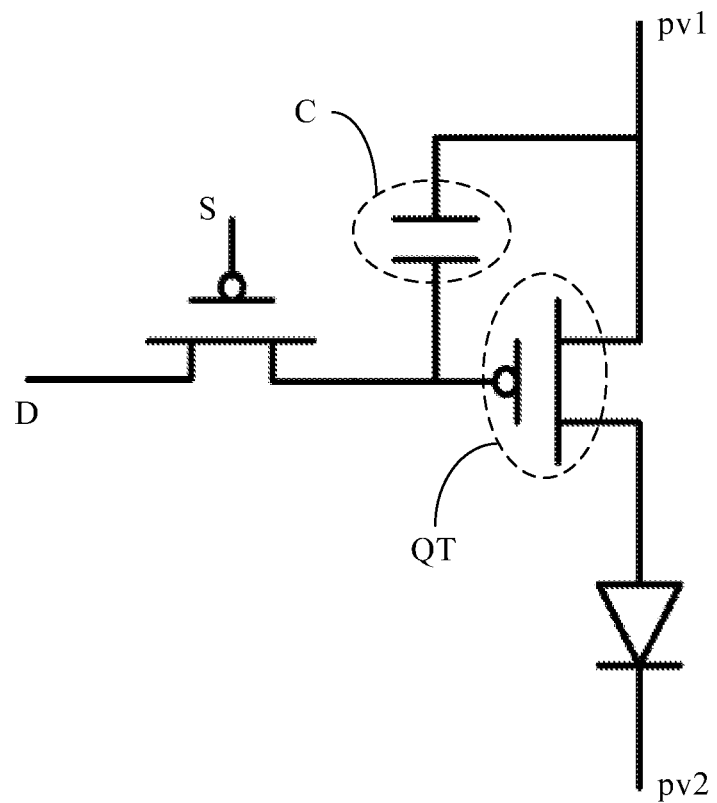
FIG. 5 illustrates an exemplary pixel driving circuit consistent with various disclosed embodiments.

Further, in some embodiments, the pixel driving circuit may include a pixel capacitor. The capacitance of the pixel capacitor in the fingerprint identification area may be greater than the capacitance of the pixel capacitor in the non-fingerprint identification area. FIG. 5 illustrates an exemplary pixel driving circuit consistent with various disclosed embodiments.

As shown in FIG. 5, the pixel driving circuit may include a pixel capacitor C. The pixel driving circuit may also at least include a data line D, a gate line S, a first power line pv1, and a second power line pv2. In some embodiment, the pixel driving circuit may include a switching transistor (not labeled) and a driving transistor QT and a diode (not labeled). The data line D may be used to provide a data signal. The gate line S may be used to provide a gate scan signal to the switching transistor. The first power line pv1 and the second power line pv2 may be both used to provide power source signals. FIG. 5 is for illustrative purposes only, and is not intended to limit the present disclosure.

The pixel capacitor C may include two plates, one plate may be connected to the first power line pv1, and the other plate may be connected to the data line D through the switch transistor. In a regular display process, the voltages applied to the first power lines pv1 of all the pixel driving circuits in the display panel may all be the same. Under a same gray scale driving signal, the voltages applied to the data lines D of all the pixel driving circuits may be the same. The pixel driving circuit may be configured to drive the light-emitting device to emit light, and the pixel capacitor C may be charged and then discharged to keep the light-emitting device emitting light for a pre-determined time. After the driving transistor QT in the pixel driving circuit being turned on, the voltage signals of the first power source line pv1 and the second power source line pv2 may be applied to the light-emitting device to control the light-emitting device to emit light.

If the driving transistor QT is a p-type driving transistor, the driving transistor QT may be turned on at a low-level potential. In the potential range in which the driving transistor QT can be turned on, the lower the potential is, the higher the conduction degree of the driving transistor QT is, and the higher the voltage the first power line pv1 can transmit to the light-emitting device through the driving transistor QT is. In one embodiment, the capacitance of the pixel capacitor C in the fingerprint identification area may be set to be greater than the capacitance of the pixel capacitor C in the non-fingerprint identification area.

Thus, under a same charging voltage and a same charging time, the potential of the pixel capacitor C in the fingerprint identification area after being charged may be lower than the potential of the pixel capacitor C in the non-fingerprint identification area after being charged. Thus, the conduction degree of the driving transistor QT in the pixel driving circuit in the fingerprint identification area may be substantially high, and the brightness of the light-emitting device may be increased. Accordingly, the brightness of the light-emitting device in the fingerprint identification area may be ensured to be greater than the brightness of the light-emitting device in the non-fingerprint identification area. Thus, under a same gray scale driving signal, the brightness of the fingerprint identification area may be increased. Further, the brightness of the fingerprint identification area may be ensured to be substantially the same as the brightness of the non-fingerprint identification area. Thus, the precision of the fingerprint identification may be improved. At the same time, the reliability of the performance of the display panel may also be ensured.

The changes in the magnitudes of the capacitances in the pixel driving circuits may be realized by adjusting the areas of the plates of the pixel capacitors. In particular, in the disclosed display panel, the areas of the plates of the pixel capacitors in the fingerprint identification area may be larger than the areas of the plates of the pixel capacitors in the non-fingerprint identification area. In the pixel driving circuit, the pixel capacitor may include two plates: a first plate and a second plate. After a voltage is applied to the two plates, a capacitor may be formed between the regions where the two plates overlap.

Figure 6:
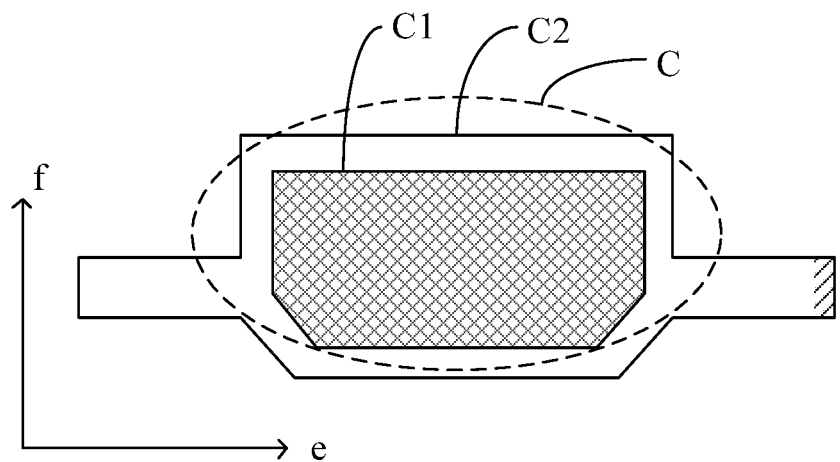
FIG. 6 illustrates a top view of a pixel capacitor of an exemplary display panel consistent with various disclosed embodiments.

FIG. 6 illustrates a pixel capacitor in an exemplary display panel consistent with various disclosed embodiments. As shown in FIG. 6, the pixel capacitor C may include a first plate C1 and a second plate C2. The areas of the plates may be adjusted by adjusting lengths of the plates along a first direction e, or the lengths of the plates along a second direction f. By adjusting the areas of the plates, the areas of the plates of the pixel capacitor in the fingerprint identification area may be adjusted to be greater than the areas of the plates of the pixel capacitor in the non-fingerprint identification area. The first direction e may be the same as the extending direction of the gate line in the display panel, and the second direction f may be the same as the extending direction of the data line in the display panel. When adjusting the areas of the plates of the pixel capacitor plate C, the area of the first plate C1 and the area of the second plate C2 of the pixel capacitor C may need to be adjusted simultaneously to ensure that the overlap area of the first plate C1 and the second plate C2 may be increased to increase the capacitance of the pixel capacitor C.

Figure 7:
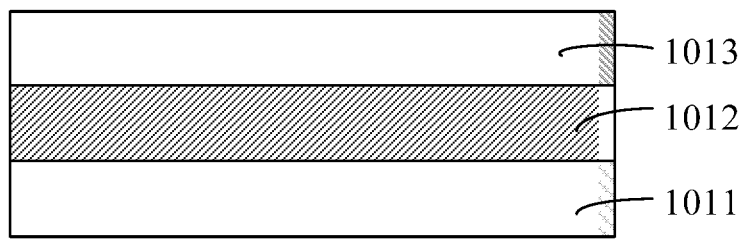
FIG. 7 illustrates a film structure of an array layer of an exemplary display panel consistent with various disclosed embodiments.

FIG. 7 illustrates an array layer of an exemplary display panel consistent with various disclosed embodiments. As shown in FIG. 7, the array layer may include a plurality of metal film layers, such as a first metal layer 1011, a second metal layer 1012, and a third metal layer 1013, etc. An insulating layer (not shown) may be disposed between two adjacent metal layers. The gate of the thin film transistor and the first plate C1 of the pixel capacitor C may be disposed at the first metal layer 1011. The second plate C2 of the pixel capacitor C may be disposed at the second metal layer 1012, and the source and the drain of the thin film transistor may be disposed at the third metal layer 1013.

Further, the pixel driving circuit may include a data line. In the fingerprint identification area and along a direction perpendicular to the display surface of the display panel, the data line may not overlap with the plates of the pixel capacitor. Such a structure may prevent the varying voltage signal provided by the data line from adversely affecting the pixel capacitance when the areas of the plates of the pixel capacitor is increased.

Figure 8:
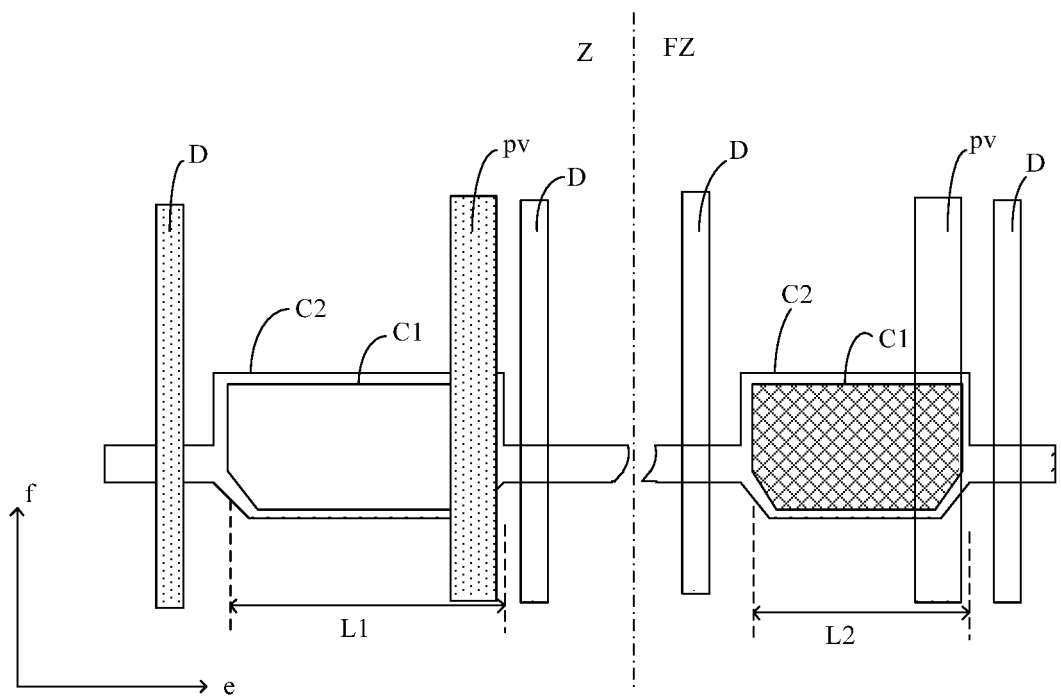
FIG. 8 illustrates a comparison between a pixel driving circuit in a fingerprint identification area and a pixel driving circuit in a non-fingerprint identification area of an exemplary display panel consistent with various disclosed embodiments.

FIG. 8 is a comparison between a structure of a pixel driving circuit in the fingerprint identification area and a structure of a pixel driving circuit in a non-fingerprint identification area of an exemplary display panel consistent with various disclosed embodiments. As shown in FIG. 8, along the first direction e, the plate C1 of the pixel capacitor C in the fingerprint identification area Z (only the first plate C1 is taken as an example) may have a length L1. Along the first direction e, the plate C1 of the pixel capacitor C in the non-fingerprint identification zone FZ (only the first plate C1 is taken as an example) may have a length L2. L1 may be greater than L2.

The pixel driving circuit may also include a data line D extending along the second direction f. In the fingerprint identification area Z and along a direction perpendicular to the display surface of the display panel, the data line D may not overlap with the plates (C1 and C2) of the pixel capacitor C. The first direction e and the second direction f may be both parallel to the display surface of the display panel, and the first direction e and the second direction f may intersect with each other.

Further, the pixel driving circuit may also include a power supply line pv extending along the second direction f. In the display phase, the power line pv may supply a constant voltage signal. In one embodiment, along the first direction e, the length of the plate of the pixel capacitor in the fingerprint identification area Z may be greater than the length of the plate of the pixel capacitor in the non-fingerprint identification area FZ. The capacitance may be increased by increasing the areas of the plates of the pixel capacitor in the fingerprint identification so as to increase the brightness of the fingerprint identification area under a same gray scale driving signal.

Further, in one embodiment, in the fingerprint identification area, while increasing the length of the pixel capacitor plate along the first direction, the data line and the plates of the pixel capacitor may be ensured not to overlap with each other. The adverse effect caused by a varying voltage signal provided by the data line may be prevented.

Further, referring to FIG. 5, the pixel driving circuit may include the driving transistor QT. The driving transistor QT may be a thin film transistor. One terminal of the driving transistor QT (e.g., the source of the thin film transistor) may be connected to the first power line pv1. The other terminal of the driving transistor QT (e.g., the drain of the thin film transistor) may be connected to a light-emitting device. The driving transistor QT may be used to supply a driving current to the light-emitting device. In the disclosed display panel, a ratio between the width of the channel region of the driving transistor QT and the length of the channel region of the driving transistor QT in the fingerprint identification region may be referred to as x1. That is, the width-to-length ratio of the channel region of the driving transistor QT in the fingerprint identification region may be referred to as x1. In the non-fingerprint identification area, the ratio of the width of the channel region of the driving transistor QT to the length of the channel region of the driving transistor QT may be referred to as x2. That is, the width-to-length ratio of the channel region of the driving transistor QT in the non-fingerprint identification area is x2, and x1<x2.

In one embodiment, by adjusting the width-to-length ratio of the channel regions of the driving transistors QT, the width-to-length ratio of the channel region of the driving transistor QT in the fingerprint identification area may be smaller than the width-to-length ratio of the channel region of the driving transistor QT in the non-fingerprint identification area. Thus, the charging capacity of the driving transistor QT in the fingerprint identification area may be reduced. Under a same charging voltage and a same charging time, the potential of the pixel capacitor C in the fingerprint identification area may be lower than the potential of the pixel capacitor C in the non-fingerprint identification area after being charged.

Thus, the conduction degree of the driving transistor QT in the pixel driving circuit in the fingerprint identification area may be increased, and the brightness of the light-emitting device in the fingerprint identification area may be increased. Accordingly, the brightness of the light-emitting device in the fingerprint identification area may be greater than the brightness of the light-emitting device in the non-fingerprint identification area, and it may ensure the brightness of the fingerprint identification area may be substantially the same as the brightness of the non-fingerprint identification area.

The shapes of the channel regions of the driving transistors in the display panel may be various, such as rectangular, U-shape, or S-shape, etc., and is not limited by the present disclosure. In the following embodiments, a rectangular channel region will be described as an example.

Figure 9:
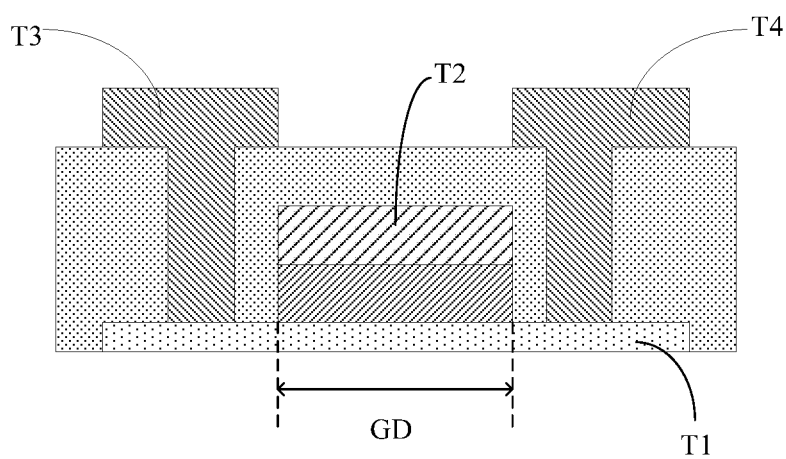
FIG. 9 illustrates a thin film transistor.
Figure 10:
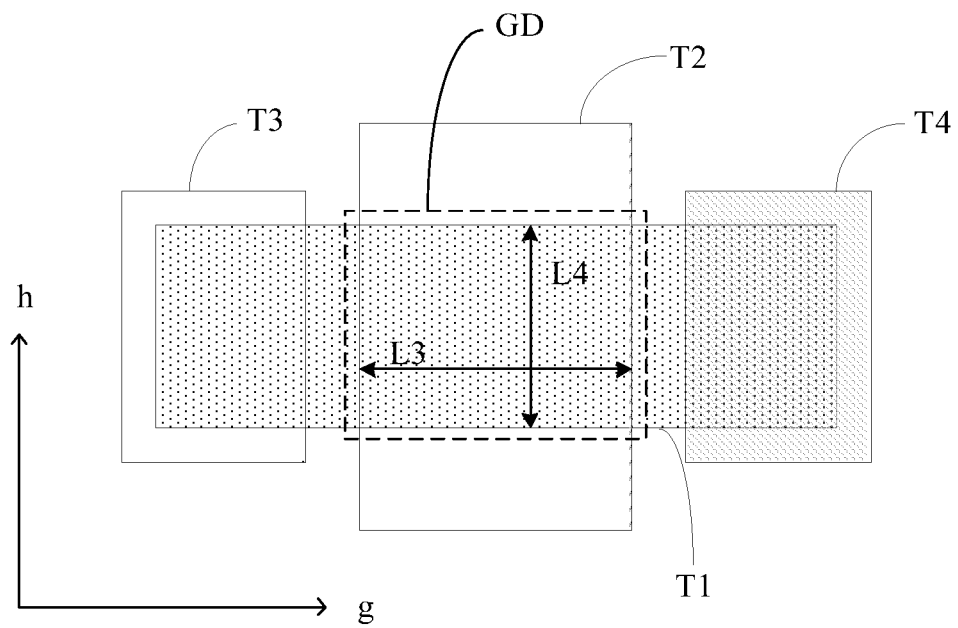
FIG. 10 illustrates a top view of the thin film transistor in FIG. 9.

FIG. 9 illustrates an exemplary thin film transistor. FIG. 10 is a top view of the thin film transistor in FIG. 9. In FIG. 9, a top-gated thin film transistor is used as an example. As shown in FIG. 9, the thin film transistor structure may include an active layer T1, a gate T2, a source T3 and a drain T4. The overlap area between the active layer T1 and the gate T2 may be configured as a channel region GD of the thin film transistor. When a voltage is applied to the gate T2, an electric field may be formed between the gate T2 and the active layer T1. The carriers in the active layer T1 may start to move to form a current due to the electric field. When the channel region GD reaches a saturation current, the thin film transistor may be turned on, and a conduction between the source T3 and the drain T4 may be formed.

As shown in FIG. 10, along the direction from the source T3 to the drain T4, the length L3 may be referred to as the channel length of the channel region GD, i.e., the length of the channel region GD along the g direction. The width L4 of the channel region GD is the length of the channel region GD along the extending direction h of the gate T2. The width and length of the channel region of other shapes of thin film transistors are determined in a similar manner to that in FIG. 10, and will not be described herein.

Adjusting the width-to-length ratio of the channel region of the driving transistor in the fingerprint identification area to be smaller than the width-to-length ratio of the channel region of the driving transistor in the non-fingerprint identification area may be achieved by adjusting the width of the channel region, or the length of the channel region, or both the width and the length of the channel region.

Figure 11:
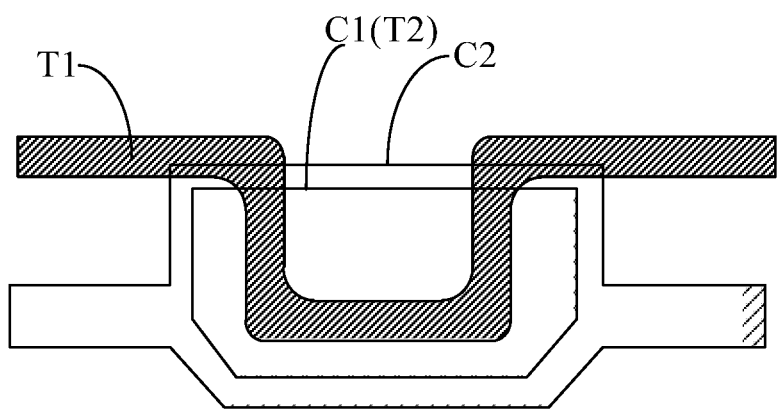
FIG. 11 illustrates a top view of another exemplary display panel consistent with various disclosed embodiments.

Further, in the film layer structure of the disclosed display panel, the active layer of the driving transistor in the pixel driving circuit may overlap with the pixel capacitor. FIG. 11 illustrates a top view of another exemplary display panel consistent with various disclosed embodiments.

As shown in FIG. 11, along the direction perpendicular to the panel surface of the display panel, the active layer T1 of the driving transistor QT may overlap with the pixel capacitor. The first plate C1 of the pixel capacitor may be multiplexed as the gate T2 of the driving transistor QT. The shape of the active layer T1 in FIG. 11 is for illustrative purposes only. The region in which the active layer T1 overlaps with the first plate C1 in FIG. 11 may be configured as the channel region. In one embodiment, the channel region of the driving transistor QT is U-shaped.

Further, in some embodiments, in the present disclosed display panel, the pixel driving circuit may include a pixel capacitor. The pixel capacitor may be at least partially disposed in the non-light-emitting area. At least in the fingerprint identification area, the first plate of the pixel capacitor and the second plate of the pixel capacitor may be made of a transparent material. The pixel capacitor may be at least partially disposed in the non-light-emitting region. In the related art, the plates of the pixel capacitor are made of a metal material, and the fingerprint identification light cannot penetrate the plates of the pixel capacitor. In the present disclosed embodiment, the plates of the pixel capacitor may be transparent. In the fingerprint identification stage, the fingerprint identification light may be able to pass through the plates of the pixel capacitor to reach the light-sensing device, which may be equivalent to further increasing the transmittance of the fingerprint identification light. Thus, the precision of the fingerprint identification may be further increased.

The transparent material may be any appropriate material. In one embodiment, the transparent material is indium tin oxide. Indium tin oxide may have desired electrical conductivity and transparency, and its transmittance may reach more than 90%. Thus, the requirements for improving the light transmittance of the fingerprint identification may be met.

Further, in the disclosed display panel, the pixel driving circuit may include a reset wiring. The reset wiring may be used to provide a reset signal. In the related art, the reset wiring is formed using a same film layer as one of the plates of the pixel capacitor, but the disclosure is different from the related art.

Figure 12:
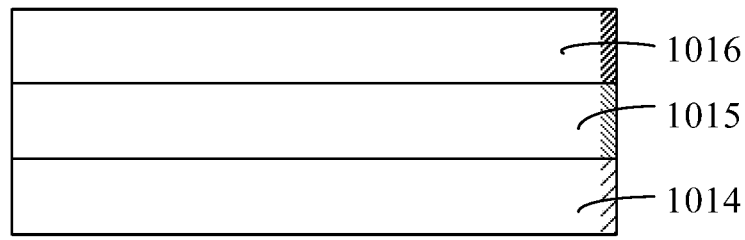
FIG. 12 illustrates a top view of another exemplary display panel consistent with various disclosed embodiments.

FIG. 12 illustrates another film structure of an exemplary display panel consistent with various disclosed embodiments. As shown in FIG. 12, the display panel may include a reset metal layer 1014, a first plate layer 1015, and a second plate layer 1016. In the fingerprint identification area Z, the first plate of the pixel capacitor may be disposed at the first plate layer 1015. The second plate of the pixel capacitor may be disposed at the second plate layer 1016. The reset wiring may be disposed at the reset metal layer 1014. In one embodiment, at least in the fingerprint identification area, the first plate and the second plate of the pixel capacitor may be made of a transparent material. That is, the first plate layer and the second plate layer may be both made of the transparent material. When the plates of the pixel capacitor disposed in the fingerprint identification area are made of a transparent material, the transmittance of the fingerprint identification light in the fingerprint identification stage may be further improved. Thus, the precision of the fingerprint identification may be further improved.

In one embodiment, after forming the plates of the pixel capacitor with the transparent material, the reset wiring may not be formed by a same film layer as one of the plates of the pixel capacitor as in the conventional fabrication method (i.e., the reset wiring is also formed by using the transparent material). The reason may be that the flatness of the film layer of the display panel may not be as desired when the reset wiring is formed. The brittleness of the transparent material may be greater than that of the metal material. If the reset wiring is made of a transparent material, the reset wiring formed on the non-flat surface may have a risk of disconnection. Further, although the transparent material may have a certain electrical conductivity, the resistivity of the transparent material is often greater than the resistivity of the metal material. Thus, the reset wiring made of a transparent material may cause a large power consumption. In the disclosed embodiment, the reliability of the reset wiring may be ensured; and the power consumption of the display panel may not be affected.

Figure 13:
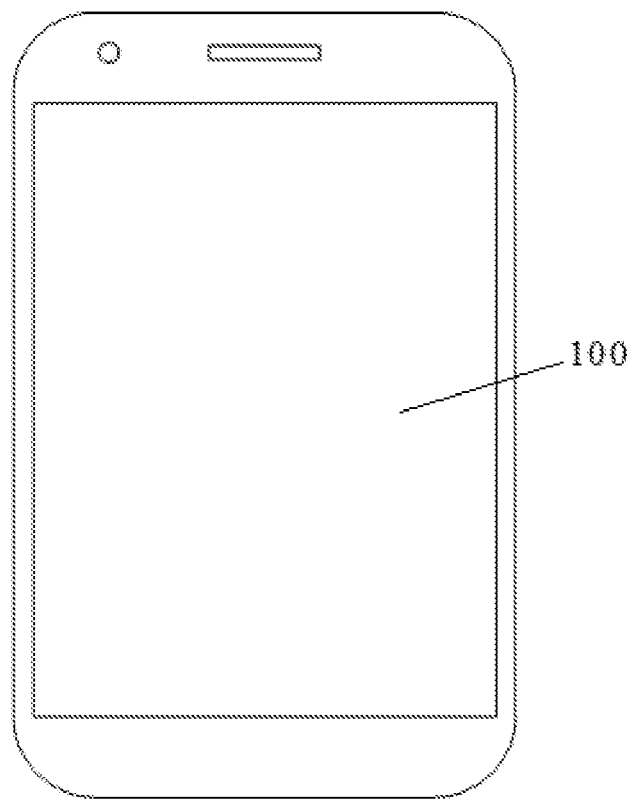
FIG. 13 illustrates an exemplary display apparatus consistent with the various disclosed embodiments.
Figure 14:
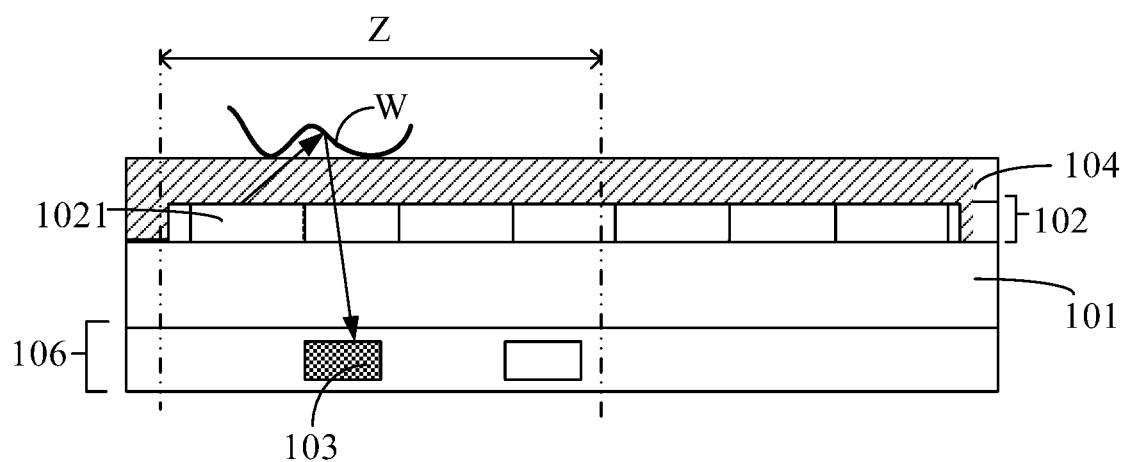
FIG. 14 illustrates a film structure of an exemplary display apparatus in FIG. 13 consistent with the various disclosed embodiments.

Further, the present disclosure provides a display apparatus. FIG. 13 illustrates an exemplary display apparatus consistent with various disclosed embodiment. FIG. 14 illustrates a film layer of a disclosed display apparatus.

As shown in FIG. 13, the display apparatus may include a display panel 100. The display panel 100 may be one of the disclosed display panels, or other appropriate display panel.

As shown in FIG. 14, the display panel 100 may include an array layer 101. The array layer 101 may include a plurality of pixel driving circuits (not shown). The display panel 100 may also include a display layer 102 disposed on a side of the array layer 101 adjacent to the light-emitting surface of the display panel. The display layer 102 may include a plurality of light-emitting devices 1021. The display panel 100 may include a plurality of light-emitting areas (not labeled). Each light-emitting area may include one light-emitting device 1021, and one pixel driving circuit (not labeled) for driving the light-emitting device 1021. Further, the display panel 100 may include a packaging structure 104. The packaging structure 104 may be disposed on a side of the display layer 102 away from the array layer 101, and the packaging structure 104 may cover the display layer 102. Further, the display panel 100 may include a fingerprint identification device 106. The fingerprint identification device 106 may include a plurality of light-sensing devices 103. The light-sensing devices 103 may be disposed on a side of the array layer 101 away from the display layer 102.

In the disclosed display apparatus, in the fingerprint identification stage, the light-emitting devices 1021 of the display layer 102 disposed in the fingerprint identification area Z may be multiplexed as a fingerprint identification light source. The light emitted by the light-emitting devices 1021 may emit from the display surface of the display apparatus to a touch body W. Then, the light may be reflected by the touch body W and may pass through a portion of the film structure of the display panel 100 and reach light-sensing device 103 to realize a fingerprint identification.

The disclosed display apparatus may be any electronic product having a display function, including but not limited to the following categories: television, laptop computer, desktop display, tablet computer, digital camera, mobile phone, smart bracelet, smart glasses, on-board display, medical equipment, industrial equipment, or touch interactive terminals, etc.

Thus, the disclosed display panel and the display apparatus may achieve the following beneficial effects.

In the present disclosure, the number of the light-emitting devices in an unit area of the fingerprint identification area may be smaller than the number of the light-emitting devices in the unit area of the non-fingerprint identification area. Such a design may increase the light transmittance of the fingerprint identification light. Accordingly, the amount of light required for the fingerprint identification and received by the light-sensing devices may be increased. Thus, the precision of the fingerprint identification may be increased.

Further, in the present disclosure, under a same gray scale driving signal, the fingerprint identification area may have a first brightness, and the non-fingerprint identification area may have a second brightness. The difference between the first brightness and the second brightness may be referred to as N, and $|N| \leq 100$ nit. The brightness of the fingerprint identification area may be substantially the same as the brightness of the non-fingerprint identification area. Thus, the human eyes may be unable to perceive the difference between the brightness of the fingerprint identification area and the brightness of the non-fingerprint identification. Accordingly, in the display phase, the overall brightness of the display panel may be uniform, and the display effect may be as desired.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A display panel, comprising:
a display area, having a plurality of light-emitting areas and a plurality of non-light-emitting areas surrounding the light-emitting areas, divided into a fingerprint identification area and a non-fingerprint identification area;
an array layer including a plurality of pixel driving circuits;
a display layer disposed on a side of the array layer adjacent to a light-emitting surface of the display panel, and including a plurality of light-emitting devices; and
a light-sensing device disposed in the fingerprint identification area and the non-light emitting area,
wherein:
a number of the light-emitting devices in an unit area in the fingerprint identification area is smaller than a number of the light-emitting devices in the unit area in the non-fingerprint identification area; and
under a same gray scale driving signal, an absolute value of a difference N between a brightness of the fingerprint identification area and a brightness of the non-fingerprint identification area is smaller than or equal to 100 nit ($|N| \leq 100$ nit).

2. The display panel according to claim 1, wherein:
one light-emitting area includes one light-emitting device; and
one pixel driving circuit drives one light-emitting device.

3. The display panel according to claim 1, wherein:
under a same gray scale driving signal, a brightness of one light-emitting device in the fingerprint identification area is greater than a brightness of one light-emitting device in non-fingerprint identification area.

4. The display panel according to claim 1, wherein:
under a same gray scale driving signal, the brightness of the fingerprint identification area is equal to the brightness of the non-fingerprint identification area.

5. The display panel according to claim 1, wherein the pixel driving circuit comprises:
a pixel capacitor,
wherein a capacitance of a pixel capacitor in the fingerprint identification area is greater than a capacitance of a pixel capacitor in the non-fingerprint identification area.

6. The display panel according to claim 5, wherein:
the pixel capacitor includes two oppositely disposed plates,
an area of one plate of the pixel capacitor in the fingerprint identification area is greater than an area of the other plate of the pixel capacitor in the non-fingerprint identification area.

7. The display panel according to claim 6, wherein the pixel driving circuit further comprises:
a data line,
wherein, in the fingerprint identification region and along a direction perpendicular to a display surface of the display panel, the data line does not overlap with the plates of the capacitor.

8. The display panel according to claim 1, wherein the pixel driving circuit comprises:
a driving transistor.

9. The display panel according to claim 8, wherein:
a width-to-length ratio x1 of a channel region of the driving transistor in the fingerprint identification area is smaller than a width-to-length ratio x2 of a channel region of the driving transistor in the non-fingerprint identification area (x1<x2).

10. The display panel according to claim 8, wherein the pixel driving circuit comprises:
a pixel capacitor,
wherein:
along a direction perpendicular to a display surface of the display panel, an active layer of the driving transistor overlaps with the pixel capacitor;
the pixel capacitor includes a first plate and an opposing second plate; and
a first plate of the pixel capacitor is multiplexed as a gate of the driving transistor.

11. The display panel according to claim 1, wherein the pixel driving circuit comprises:
a pixel capacitor at least partially disposed in the non-light-emitting area.

12. The display panel according to claim 11, at least in the fingerprint identification region,
wherein:
the pixel capacitor includes a first plate and an opposing second plate; and
the first plate of the pixel capacitor and the second plate of the pixel capacitor are both made of a transparent material.

13. The display panel according to claim 12, wherein:
the transparent material is made of indium tin oxide.

14. The display panel according to claim 13, further comprising:
a reset metal layer,
wherein:
the pixel driving circuit includes reset wirings; and
the reset wirings are disposed in the reset metal layer.

15. The display panel according to claim 14, further comprising:
a first plate layer; and
a second plate layer,
wherein:
in the fingerprint identification area, the first plate of the pixel capacitor is disposed at the first plate layer;
the second plate of the pixel capacitor is disposed at the second plate layer;
the reset metal layer and the first plate layer are dispose at different layers; and
the reset metal layer and the second plate layer are disposed at different layers.

16. A display apparatus, comprising:
a display panel,
wherein the display panel comprises:
a display area, having a plurality of light-emitting areas and a plurality of non-light-emitting areas surrounding the light-emitting areas, and divided into a fingerprint identification area and a non-fingerprint identification area;
an array layer, including a plurality of pixel driving circuits;
a display layer, disposed on a side of the array layer adjacent to a light-emitting surface of the display panel, and including a plurality of light-emitting devices; and
a light-sensing device disposed in the fingerprint identification area and the non-light emitting area,
wherein:
a number of the light-emitting devices in an unit area in the fingerprint identification area is smaller than a number of the light-emitting devices in the unit area of the non-fingerprint identification area; and
under a same gray scale driving signal, an absolute value of a difference N between a brightness of the fingerprint identification area and a brightness of the non-fingerprint identification area is smaller than or equal to 100 nit ($|N|\leq100$ nit).

17. The display apparatus according to claim 16, further comprising:
a packaging structure disposed on a side of the display layer away from the array layer and covering the display layer; and
a fingerprint identification apparatus.

18. The display apparatus according to claim 17, wherein the fingerprint identification apparatus comprises:
a plurality of light-sensing devices disposed on a side of the array layer away from the display layer.

19. The display apparatus according to claim 16, wherein:
under the same gray scale driving signal, a brightness of one light-emitting device in the fingerprint identification area is greater than a brightness of one light emitting device in the non-fingerprint identification area.

20. The display apparatus according to claim 16, wherein the pixel driving circuit comprises:
a pixel capacitor,
wherein a capacitance of a pixel capacitor in the fingerprint identification area is greater than a capacitance of a pixel capacitor in the non-fingerprint identification area.

* * * * *